US010527299B2

(12) United States Patent
Hashimoto et al.

(10) Patent No.: US 10,527,299 B2
(45) Date of Patent: Jan. 7, 2020

(54) OUTDOOR UNIT FOR AIR CONDITIONER, AND AIR CONDITIONER

(71) Applicant: Hitachi-Johnson Controls Air Conditioning, Inc., Tokyo (JP)

(72) Inventors: Takayuki Hashimoto, Tokyo (JP); Takashi Ooishi, Tokyo (JP); Masayoshi Murofushi, Tokyo (JP)

(73) Assignee: Hitachi-Johnson Controls Air Conditioning, Inc., Tokyo (JP)

( * ) Notice: Subject to any disclaimer, the term of this patent is extended or adjusted under 35 U.S.C. 154(b) by 14 days.

(21) Appl. No.: 15/748,254

(22) PCT Filed: Jul. 31, 2015

(86) PCT No.: PCT/JP2015/071733
§ 371 (c)(1),
(2) Date: Jan. 29, 2018

(87) PCT Pub. No.: WO2017/022001
PCT Pub. Date: Feb. 9, 2017

(65) Prior Publication Data
US 2018/0216836 A1 Aug. 2, 2018

(51) Int. Cl.
*F24F 1/24* (2011.01)
*F24F 1/22* (2011.01)
(Continued)

(52) U.S. Cl.
CPC .................. *F24F 1/24* (2013.01); *F24F 1/22* (2013.01); *F24F 1/26* (2013.01); *F24F 1/50* (2013.01); *H05K 7/20936* (2013.01)

(58) Field of Classification Search
CPC ........ F24F 1/24; F24F 1/22; F24F 1/00; F24F 1/26; F24F 1/46; F24F 1/20; F24F 1/50;
(Continued)

(56) References Cited

U.S. PATENT DOCUMENTS

2011/0079033 A1* 4/2011 Okuda ...................... F24F 1/22
62/259.2
2011/0126568 A1* 6/2011 Okuda ...................... F24F 1/24
62/259.2
(Continued)

FOREIGN PATENT DOCUMENTS

CN 204006418 U 12/2014
EP 2 314 940 A1 4/2011
(Continued)

OTHER PUBLICATIONS

International Search Report of PCT/JP2015/071733 dated Nov. 17, 2015.
(Continued)

*Primary Examiner* — Emmanuel E Duke
(74) *Attorney, Agent, or Firm* — Mattingly & Malur, PC

(57) ABSTRACT

An outdoor unit for an air conditioner, and an air conditioner are provided that allow for effectively cooling a cooled part such as a power element, even when a refrigerant is not circulated, to prevent the part from being damaged by generated heat. Said outdoor unit and said air conditioner each include: a casing; a heat exchanger that exchanges heat between a refrigerant flowing therein and air; a blower fan that sucks air outside the casing and forces the air to pass through the heat exchanger; an electric parts box that has a board and a part to be cooled; and a cooling member that is thermally connected with said part and cools it with a refrigerant flowing therein, wherein the cooling member is arranged on an outer wall surface of the electric parts box in a path of the air blown by the blower fan.

20 Claims, 10 Drawing Sheets

(51) Int. Cl.
*F24F 1/50* (2011.01)
*F24F 1/26* (2011.01)
*H05K 7/20* (2006.01)

(58) Field of Classification Search
CPC ..... H05K 7/20936; F25D 17/06; F25D 23/00; F25D 23/003; F25B 31/006
See application file for complete search history.

(56) References Cited

U.S. PATENT DOCUMENTS

| | | | | |
|---|---|---|---|---|
| 2012/0279251 | A1* | 11/2012 | Kido | F24F 1/24 62/498 |
| 2014/0138073 | A1* | 5/2014 | Teraki | H01L 23/473 165/178 |
| 2014/0190196 | A1 | 7/2014 | Okuda et al. | |
| 2014/0326437 | A1* | 11/2014 | Kamitani | F24F 1/22 165/122 |
| 2015/0059389 | A1* | 3/2015 | Liu | F24F 1/24 62/259.2 |
| 2015/0082822 | A1* | 3/2015 | Teraki | F24F 1/24 62/259.2 |
| 2015/0128631 | A1* | 5/2015 | Oguri | F24F 1/22 62/259.2 |

FOREIGN PATENT DOCUMENTS

| | | |
|---|---|---|
| EP | 2645008 A1 | 10/2013 |
| EP | 2 857 764 A1 | 4/2015 |
| JP | 62-69066 A | 3/1987 |
| JP | 5-44961 A | 2/1993 |
| JP | 2002-156149 A | 5/2002 |
| JP | 2006-214633 A | 8/2006 |
| JP | 2008-70016 A | 3/2008 |
| JP | 2008-121966 A | 5/2008 |
| JP | 2009-299957 A | 12/2009 |
| JP | 2009-299975 A | 12/2009 |
| JP | 2010-114115 A | 5/2010 |
| JP | 2010-117107 A | 5/2010 |
| JP | 2010-145054 A | 7/2010 |
| JP | 2011-033340 A | 2/2011 |
| JP | 2011-99577 A | 5/2011 |
| JP | 2011-190958 A | 9/2011 |
| JP | 2012-67962 A | 4/2012 |
| WO | 2011/067905 A1 | 6/2011 |

OTHER PUBLICATIONS

Extended European Search Report received in corresponding European Application No. 15900315.1 dated Feb. 14, 2019.

* cited by examiner

OUTDOOR UNIT FOR AIR CONDITIONER, AND AIR CONDITIONER

CROSS REFERENCE TO RELATED APPLICATION

This application is a U.S. National Stage Application under 35 U.S.C § 371 of International Patent Application No. PCT/JP2015/071733 filed 31 Jul. 2015.

TECHNICAL FIELD

The present invention relates to an outdoor unit for an air conditioner, and an air conditioner.

BACKGROUND ART

An air conditioner, in which a refrigerant is circulated to operate a vapor-compression refrigeration cycle, includes an electric circuit such as an inverter circuit for controlling operation of a compressor. An inverter circuit generally uses a power element, which generates high heat, and a conventional air conditioner is provided with a means of cooling the power element so as to prevent a temperature of the power element from rising beyond its operable range. As an example of such a cooling means, Japanese Patent Application Publication No. S62-69066 discloses a structure of cooling a power element with a refrigerant used in a refrigeration cycle. In the air conditioner of Japanese Patent Application Publication No. S62-69066, a refrigerant passage through which a refrigerant used for a refrigeration cycle flows is attached to a refrigerant jacket (a heat sink in Japanese Patent Application Publication No. S62-69066), a power element is fixed to the refrigerant jacket, and the refrigerant jacket is housed in an electric parts box. In addition, Japanese Patent Application Publication No. 2009-299975 discloses a structure in which a service opening is provided on the outer surface of an outdoor unit casing for visually checking a state of the refrigerant jacket being connected with the power element through the service opening at the time of such as manufacturing and repairing, wherein the refrigerant jacket faces the service opening and the refrigerant jacket is arranged at a position closer in depth than the power element as viewed from the service opening.

SUMMARY OF THE INVENTION

Problems to be Solved

However, in the structure disclosed in Japanese Patent Application Publication No. 2009-299975, that is, the refrigerant jacket is arranged at a position closer in depth than the power element as viewed from the service opening, the power element is not cooled once the circulation of the refrigerant in the refrigeration cycle stops, and will likely be damaged.

In view of the above problems, the present invention is intended to provide an outdoor unit for an air conditioner, and an air conditioner that allow for effectively cooling a part to be cooled (a cooled part) such as a power element, even when a refrigerant is not circulated, to prevent the part from being damaged by generated heat.

Solution to Problems

In order to solve the above problems, the present invention provides an outdoor unit for an air conditioner including: a casing; a heat exchanger that exchanges heat between a refrigerant flowing therein and air; a blower fan that sucks air outside the casing and forces the air to pass through the heat exchanger; an electric parts box that has a board and a part to be cooled; and a cooling member that is thermally connected with the part to be cooled and cools the part with a refrigerant flowing therein, wherein the cooling member is arranged on an outer wall surface of the electric parts box in a path of the air blown by the blower fan.

Advantageous Effects of the Invention

The present invention provides an outdoor unit for an air conditioner, and an air conditioner that allow for effectively cooling a part to be cooled such as a power element, even when a refrigerant is not circulated, to prevent the part from being damaged by generated heat.

DETAILED DESCRIPTION OF EMBODIMENTS

Hereinafter, embodiments of the present invention will be described with reference to the drawings.

First Embodiment

Figure 1:
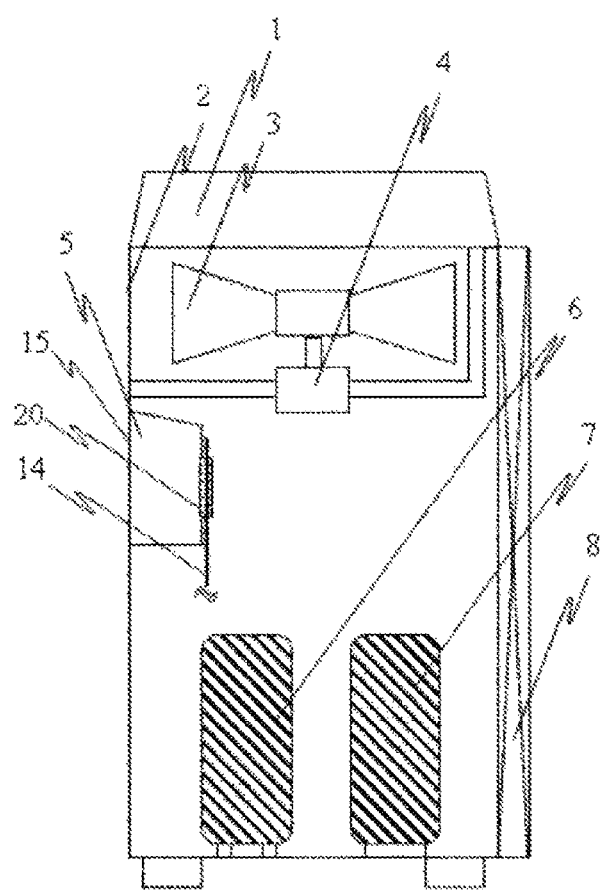
FIG. 1 is a side view of an outdoor unit for an air conditioner according to a first embodiment of the present invention.
Figure 3:
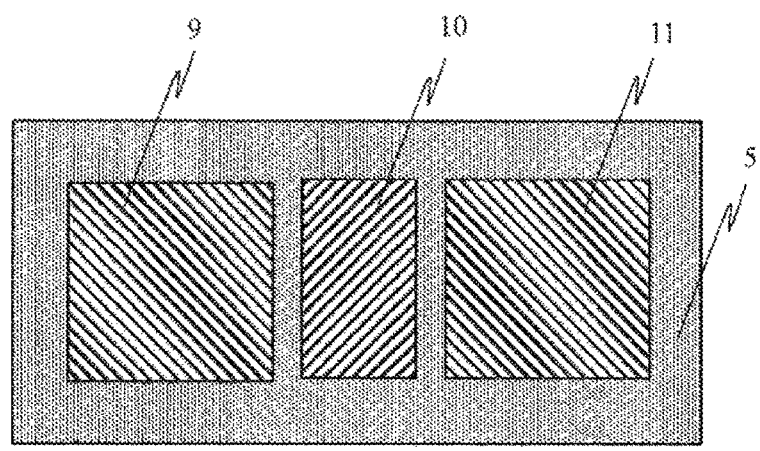
FIG. 3 is a front view of an electric parts box in the first embodiment of the present invention.
Figure 4:
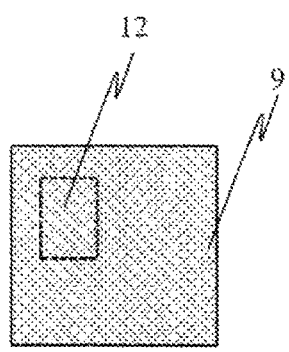
FIG. 4 is a front view of an inverter board in the first embodiment of the present invention.
Figure 5:
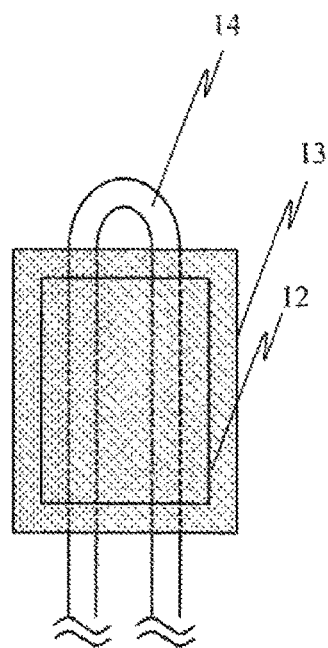
FIG. 5 is a front view of a power element and a refrigerant jacket in the first embodiment of the present invention.
Figure 6:
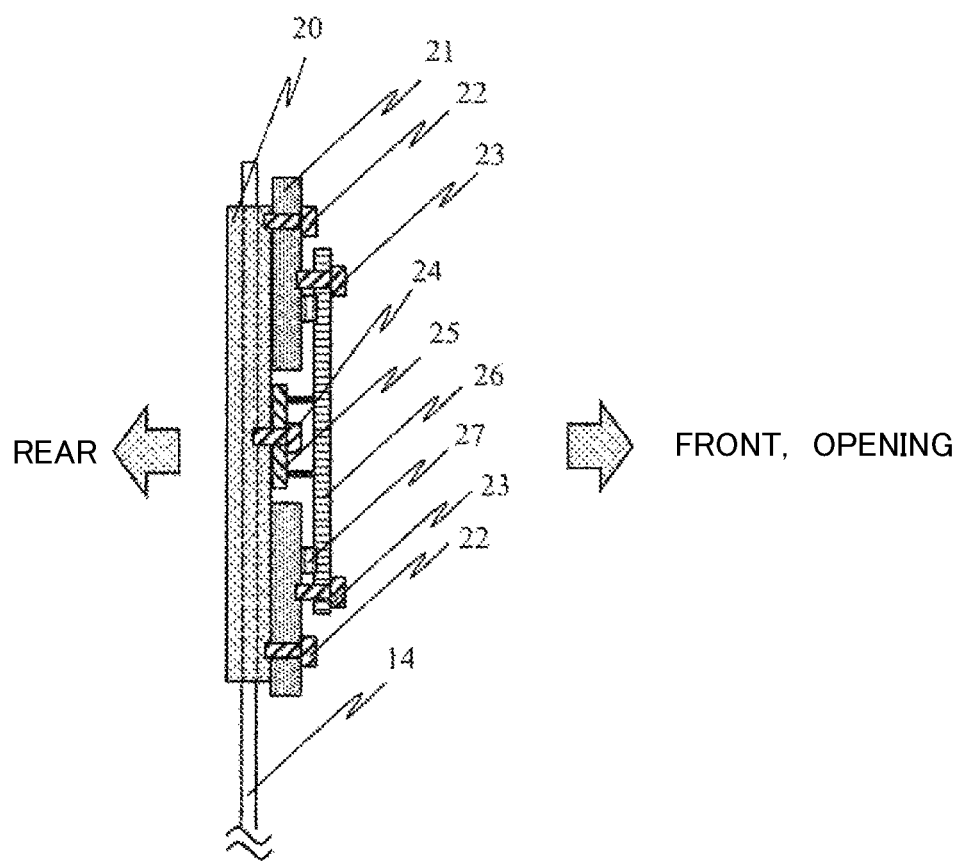
FIG. 6 is a side view of the inverter board, the electric parts box, and the refrigerant jacket in the first embodiment of the present invention.

First embodiment of the present invention will be described with reference to FIGS. 1 to 6. FIG. 1 is a side view of an outdoor unit, FIG. 2 is a front view of the outdoor unit in FIG. 1, FIG. 3 is a front view of an electric parts box, FIG. 4 is a front view of an inverter board, FIG. 5 is a front view of a power element and a refrigerant jacket 6, and FIG. 6 is a side view of the inverter board and the refrigerant jacket.

The outdoor unit for an air conditioner in FIG. 1 includes a fan guard 1, a blower fan 3, a fan motor 4, an electric parts box 5, a compressor 6, an accumulator 7, and a heat exchanger 8. The outdoor unit has a service opening 15 on a front face 2 of its casing. The compressor 6 sucks and compresses a refrigerant and discharges the compressed refrigerant. The compressor 6 may be selected from various compressors such as a scroll compressor. The heat exchanger 8 is an air heat exchanger for heat exchanging the refrigerant with the ambient air, and may be selected from a cross-flow fin-and-tube heat exchanger or the like. The blower fan 3 is a propeller fan arranged at an upper center part of the outdoor unit, and blows the ambient air passed through the heat exchanger 8 upward. The accumulator 7 separates the incoming refrigerant into gas and liquid and transfers the separated gas refrigerant to the compressor 6. The electric parts box 5 contains electric parts in a container formed of sheet metal, and is arranged on a side surface of the outdoor unit casing so as to be disposed in a path of the air blown by the blower fan 3 within a casing of the outdoor unit. For cooling some of electric parts, which need to be cooled, the electric parts box 5 has a refrigerant jacket 20 and a refrigerant pipe 14 fixed thereto, as will be described in detail later.

Figure 2:
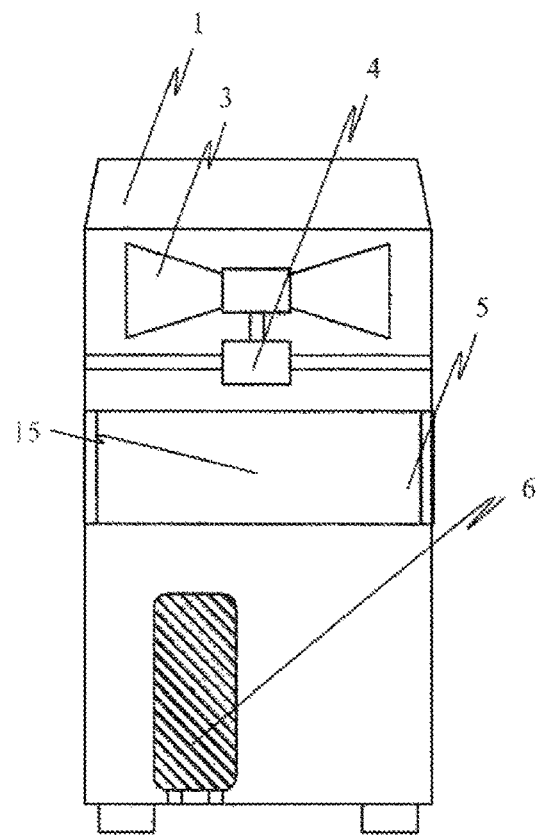
FIG. 2 is a front view of the outdoor unit for an air conditioner according to the first embodiment of the present invention.

FIG. 2 shows a front view of the unit in FIG. 1. As viewed with the service opening 15 open at the front of the outdoor unit for an air conditioner, the electric parts box 5 is arranged at the front. FIG. 3 shows a detailed front view of the electric parts box 5 shown in FIG. 2. The main components constituting the electric parts box 5 are an inverter board 9, a noise filter board 10, and a control board 11, where the inverter board 9 supplies electric power for driving the compressor 6, and the noise filter board 10 reduces electric noise generated in the inverter board 9. The control board 11 transmits a signal between the outdoor unit and indoor unit of the air conditioner. FIG. 4 shows a front view of the inverter board 9, where a power element 12 is arranged on the back surface of the inverter board 9. FIG. 5 shows the power element 12 and the refrigerant jacket 13.

The power element 12 is a switching element of an inverter circuit of the inverter board 9 that supplies electric power to the compressor 6, and is a heat generating part which generates heat during operation of the compressor 6. That is, the power element 12 is one of the parts which need to be cooled, and may be heated to exceed the operating temperature range unless being sufficiently cooled. The refrigerant jacket 13 is made of a metal such as aluminum in a flat rectangular parallelepiped shape, and covers a part of the refrigerant pipe 14 connected to the heat exchanger 8 so as to be thermally connected with the refrigerant pipe 14. The refrigerant pipe 14 is folded back in a U shape after passing through the refrigerant jacket 13, and passes through the refrigerant jacket 13 again. That is, the refrigerant jacket 13 and the refrigerant pipe 14 constitute a cooling member in which the refrigerant used in the refrigeration cycle is circulated to cool the power element 12.

FIG. 6 shows a side view of the inverter board 26, the electric-parts-box sheet metal 21, and the refrigerant jacket 20. The refrigerant jacket 20 is attached to the electric-parts-box sheet metal 21 to cool the power element 25 mounted on the inverter board 26. The refrigerant jacket 20 is fixed to the electric parts box 21 with the refrigerant-jacket mounting screws 22. The inverter board 26 is fixed to the electric parts box 21 with board mounting screws 23. The power element 25 is fixed to the refrigerant jacket 20 with a power-element mounting screw 24.

The refrigerant-jacket mounting screws 22, the board mounting screws 23, and the power-element mounting screw 24 are screwed from sides of the components to be mounted facing the service opening 15 (front side) to improve maintainability. The electric-parts-box sheet metal 21 has an opening in a part thereof to allow for directly connecting the refrigerant jacket 20 with the power element 25. Heat of the power element 25 is conducted to the refrigerant jacket 20 so as to be dissipated to the refrigerant flowing through the refrigerant pipe.

The refrigerant flowing through the refrigerant jacket 20 is condensed in the heat exchanger 8 of the outdoor unit during the cooling operation to have a temperature lower than that of the power element 25, and is condensed in a heat exchanger of the indoor unit during the heating operation to have a temperature lower than that of the power element 25. The temperature of the refrigerant flowing through the refrigerant jacket 20 may differ depending on such as operating conditions and ambient air conditions, but is about 40° C. to 45° C., for example, during the cooling operation, so that heat generated by the power element 25 on the inverter board 26 is conducted to the refrigerant jacket 20 so as to be dissipated to the refrigerant flowing through the refrigerant pipe 14 in the refrigerant jacket 20. This allows the power element 25 to keep having an operable temperature.

As shown in FIG. 6, the refrigerant jacket 20 is arranged on the outer wall surface of the electric parts box 5 in a path of the air blown by the blower fan 3, to allow for effectively cooling the power element 25 with the air blown by the blower fan 3, even when the refrigerant is not circulated, so that the power element 25 is prevented from being damaged by generated heat.

In particular, the refrigerant jacket 20 is arranged on the rear side of the electric parts box 5 facing the central space of the outdoor unit, which has large volumes of air in the path of blown air, to further improve cooling performance. Additionally, even when the refrigerant is being circulated, cooling with blown air is made in addition to cooling with the refrigerant to improve the cooling performance. Further, as compared with conventionally-used aluminum fins for air-cooling, the refrigerant jacket 20 for refrigerant-cooling can be made thinner so as not to hinder the air blown by the blower fan 3 from flowing, to improve efficiency of blowing air and therefore to improve heating efficiency or cooling efficiency as an air conditioner.

Furthermore, the refrigerant jacket 20 is arranged on the rear side of the outdoor unit to allow parts requiring maintenance such as the inverter board 26 and the power element 25 to be arranged at positions closer in depth to the front side than the refrigerant jacket so as to be viewed through the service opening 15, when the service opening 15 is open, to improve the maintainability. Further, parts such as the inverter board 26 and the power element 25 are not exposed to the path of blown air, to improve reliability of the parts.

Figure 7A:
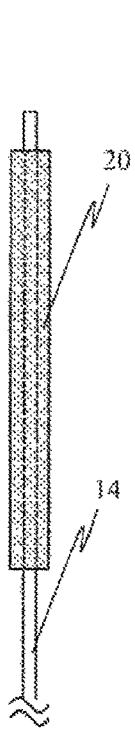
FIGS. 7A to 7E shows components in the first embodiment of the present invention as assembled in respective manufacturing steps.
Figure 7B:
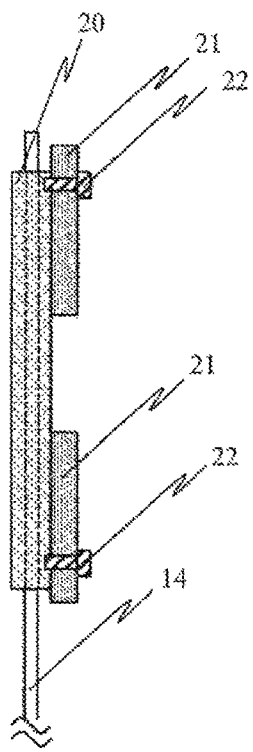
Figure 7C:
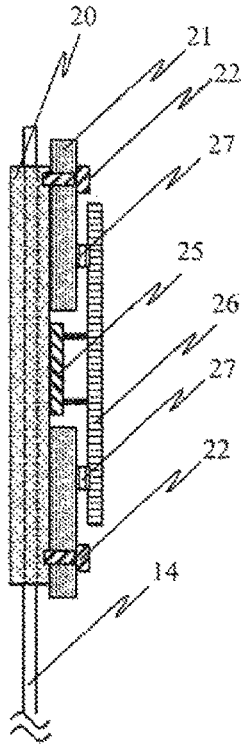
Figure 7D:
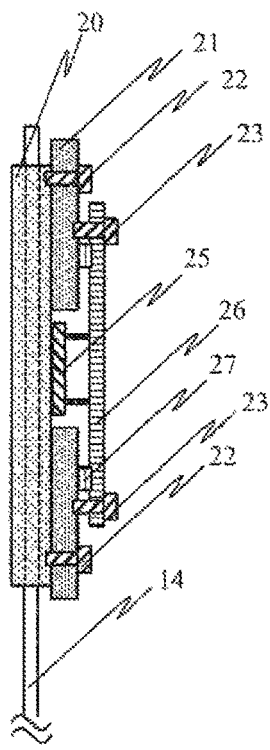
Figure 7E:
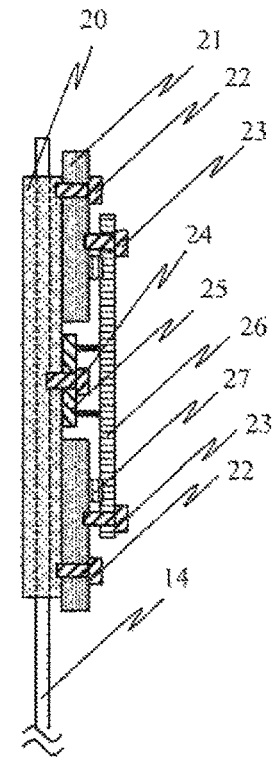

FIGS. 7A to 7E show components in the first embodiment of the present invention as assembled in respective manufacturing steps. In FIG. 7A, the refrigerant pipe 14 is attached to the refrigerant jacket 20. In FIG. 7B, the refrigerant jacket 20 is fixed to the electric-parts-box sheet metal 21 with the refrigerant-jacket mounting screws 22. In FIG. 7C, the inverter board 26 mounted with the power element 25 is attached to the electric-parts-box sheet metal 21 via spacers 27. In FIG. 7D, the inverter board 26 is fixed to the electric-parts-box sheet metal 21 with the board mounting screws 23. In FIG. 7E, the power element 25 is fixed to the electric-parts-box sheet metal 21 with the power-element mounting screw 24.

The refrigerant jacket 20, the electric-parts-box sheet metal 21, the power element 25, and the inverter board 26 are unitedly fixed to each other through manufacturing steps associated with FIGS. 7A to 7E. In addition, at the time of fixing, the refrigerant-jacket mounting screws 22, the board mounting screws 23, and the power-element mounting screw 24 are screwed from a common direction, and particularly, all the screws are screwed and removed on the sides of the above-described components facing the service opening 15 to significantly improve the working efficiency. Further, the power element 25 is located so as to face a solder surface (rear surface) of the inverter board 26, to allow for avoiding the power element 25 from occupying a component surface (front surface) of the inverter board 26 and thus for adopting a smaller inverter board 26 to reduce costs.

Second Embodiment

Figure 8:
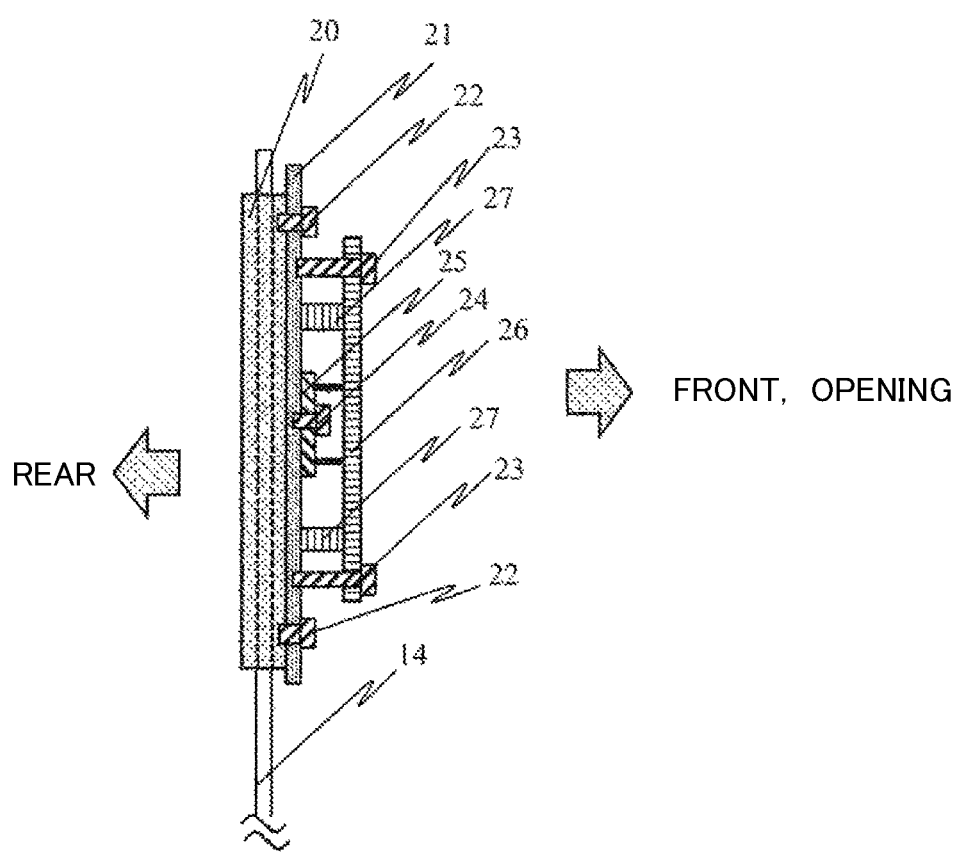
FIG. 8 is a side view of the inverter board, the electric parts box, and the refrigerant jacket in a second embodiment of the present invention.

A second embodiment of the present invention will be described with reference to FIG. 8. FIG. 8 is a side view of the inverter board 26, the electric-parts-box sheet metal 21, and the refrigerant jacket 20. The second embodiment in FIG. 8 is different from the first embodiment in FIG. 6 on the point that the power element 25 is in contact with the refrigerant jacket 20 via the electric-parts-box sheet metal 21. In FIG. 8, the refrigerant jacket 20 is attached to the electric-parts-box sheet metal 21 to cool the power element 25 mounted on the inverter board 26. The refrigerant jacket 20 is fixed to the electric-parts-box sheet metal 21 with the refrigerant-jacket mounting screws 22. The inverter board 26 is fixed to the electric-parts-box sheet metal 21 with the board mounting screws 23. The power element 25 is attached to the electric-parts-box sheet metal 21 with the power-element mounting screw 24. Heat of the power element 25 is conducted to the refrigerant jacket 20 via the electric-parts-box sheet metal 21 so as to be dissipated to the refrigerant flowing through the refrigerant pipe 14.

Also in the present embodiment, the refrigerant jacket 20 is arranged on the rear surface of the electric parts box 5 in the path of the air blown by the blower fan 3, to allow for cooling the power element 25 with the air blown by the blower fan 3, even when the refrigerant is not circulated, so that the power element 25 is prevented from being damaged by generated heat. In addition, the power element 25 is attached to the refrigerant jacket 20 via the electric-parts-box sheet metal 21 to allow for eliminating a manufacturing step of forming an opening in the electric-parts-box sheet metal 21 to reduce manufacturing costs. Further, the electric-parts-box sheet metal 21 is also cooled at the same time to allow for cooling other parts (such as capacitors and reactors) in the electric parts box 25 to improve the life of said other parts.

Figure 9A:
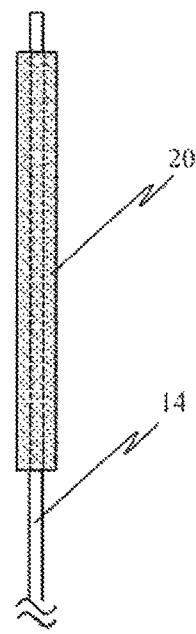
FIGS. 9A to 9D shows components in the second embodiment of the present invention as assembled in respective manufacturing steps.
Figure 9B:
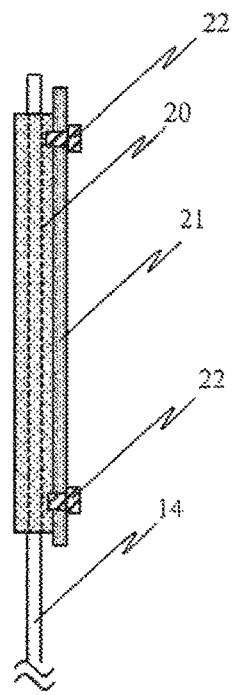
Figure 9C:
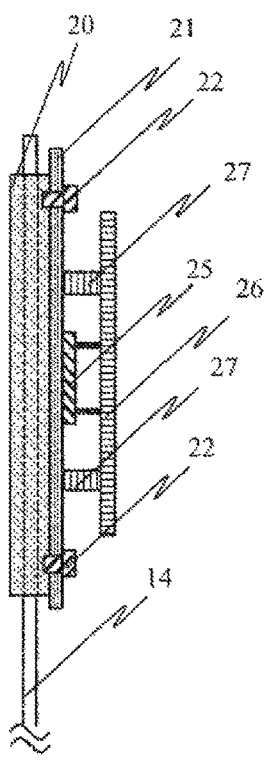
Figure 9D:
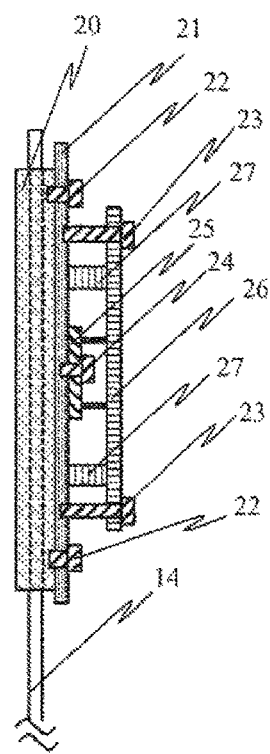

FIGS. 9A to 9D show components in the second embodiment of the present invention as assembled in respective manufacturing steps. In FIG. 9A, the refrigerant pipe 14 is attached to the refrigerant jacket 20. In FIG. 9B, the refrigerant jacket 20 is fixed to the electric-parts-box sheet metal 21 with the refrigerant-jacket mounting screws 22. In FIG. 9C, the inverter board 26 mounted with the power element 25 is attached to the electric-parts-box sheet metal 21 via the spacer 27. In FIG. 9D, the inverter board 26 is fixed to the electric-parts-box sheet metal 21 with the board mounting screws 23, and the power element 25 is fixed to the electric-parts-box sheet metal 21 with the power-element mounting screw 24.

Third Embodiment

Figure 10:
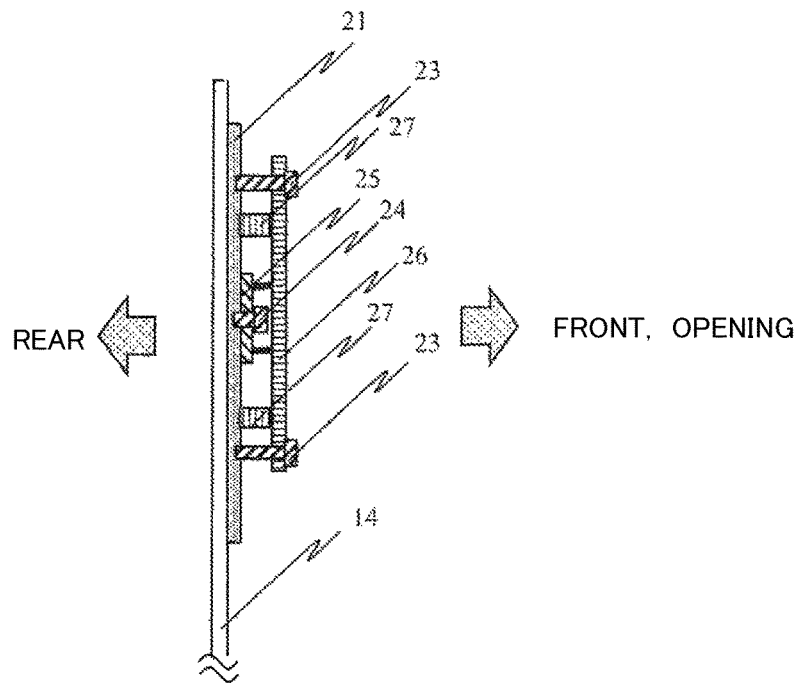
FIG. 10 is a side view of the inverter board, the electric parts box, and the refrigerant jacket in a third embodiment of the present invention.

A third embodiment of the present invention will be described with reference to FIG. 10. FIG. 10 is a side view of the inverter board 26, the electric-parts-box sheet metal 21, and the refrigerant pipe 14. The third embodiment in FIG. 10 is different from the first embodiment in FIG. 6 on the point that the electric-parts-box sheet metal 21 is in direct contact with the refrigerant pipe 14 to have no refrigerant jacket 20 therearound. The inverter board 26 is fixed to the electric-parts-box sheet metal 21 with the board mounting screws 23. The power element 25 is fixed to the electric-parts-box sheet metal 21 with the power-element mounting screw 24. Heat of the power element 25 is conducted to the refrigerant pipe 14 so as to be dissipated to the refrigerant flowing through the refrigerant pipe 14.

Also in the present embodiment, the refrigerant pipe 14 is arranged on the rear surface of the electric parts box 5 in the path of the air blown by the blower fan 3, to allow for cooling the power element 25 with the air blown by the blower fan 3, even when the refrigerant is not circulated, so that the power element 25 is prevented from being damaged by generated heat. Additionally, the refrigerant jacket 20 is eliminated to reduce costs, but a structure of cooling the power element 25 is still achieved.

Fourth Embodiment

Figure 11:
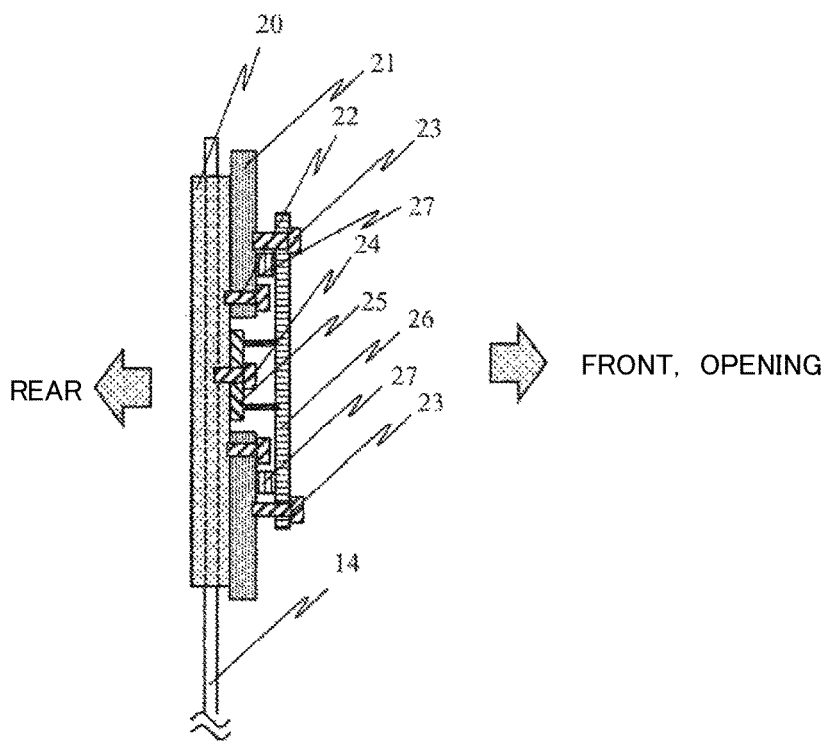
FIG. 11 is a side view of the inverter board, the electric parts box, and the refrigerant jacket in a fourth embodiment of the present invention.

A fourth embodiment of the present invention will be described with reference to FIG. 11. FIG. 11 is a side view of the inverter board 26, the electric-parts-box sheet metal 21, and the refrigerant jacket 20. The fourth embodiment in FIG. 11 is different from the first embodiment in FIG. 6 on the point that the refrigerant-jacket mounting screws 22 are screwed at positions closer to the center of the inverter board 26 than those of the board mounting screws 23. As the refrigerant-jacket mounting screws 22 are screwed at the positions closer to the power element 25 than those of the board mounting screws 23, the refrigerant jacket 20 is secured at the positions closer to the power element 25. In FIG. 11, the refrigerant jacket 20 is attached to the electric-parts-box sheet metal 21 to cool the power element 25 mounted on the inverter board 26. The refrigerant jacket 20 is fixed to the electric-parts-box sheet metal 21 with the refrigerant-jacket mounting screws 22. The inverter board 26 is fixed to the electric-parts-box sheet metal 21 with the board mounting screws 23. The power element 25 is fixed to the refrigerant jacket 20 with the power-element mounting screw 24. Heat of the power element 25 is conducted to the refrigerant jacket 20 so as to be dissipated to the refrigerant flowing through the refrigerant pipe 14.

Also in the present embodiment, the refrigerant jacket 20 is arranged on the rear surface of the electric parts box 5 in the path of the air blown by the blower fan 3, to allow for cooling the power element 25 with the air blown by the blower fan 3, even when the refrigerant is not circulated, so that the power element 25 is prevented from being damaged by generated heat.

Fifth Embodiment

Figure 12:
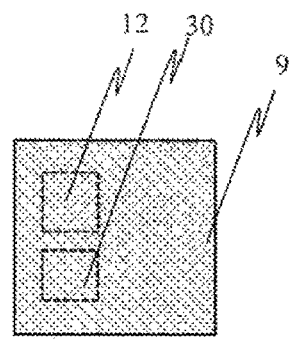
FIG. 12 is a front view of the inverter board in a fifth embodiment of the present invention.
Figure 13:
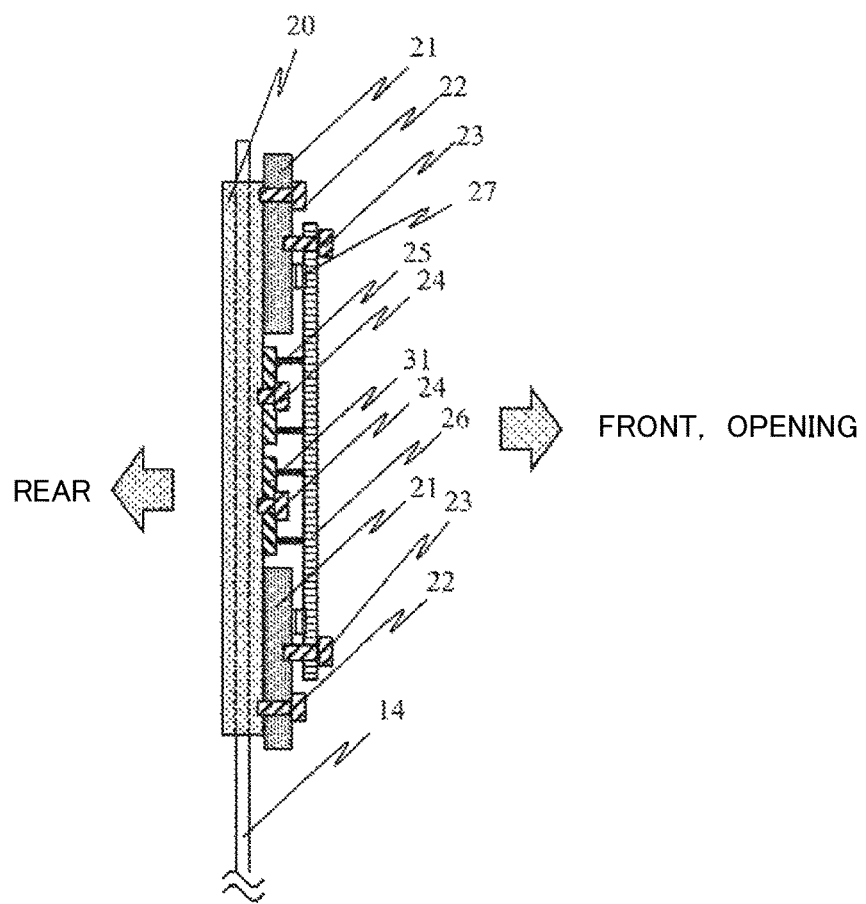
FIG. 13 is a side view of the inverter board, the electric parts box, and the refrigerant jacket in the fifth embodiment of the present invention.

A fifth embodiment of the present invention will be described with reference to FIGS. 12 to 14. FIG. 12 is a front view of the inverter board 9. The inverter board 9 in FIG. 12 is different from that in FIG. 4 on the point that more than one power element, i.e., the first power element 12 and a second power element 30, is mounted on the inverter board 9. FIG. 13 is a side view of the components in FIG. 12. The embodiment in FIG. 12 is different from the first embodiment in FIG. 6 on the point that more than one power element is mounted. In FIG. 13, the refrigerant jacket 20 is attached to the electric-parts-box sheet metal 21 to cool the first power element 25 and second power element 31 mounted on the inverter board 26. The refrigerant jacket 20 is fixed to the electric-parts-box sheet metal 21 with the refrigerant-jacket mounting screws 22. The inverter board 26 is fixed to the electric-parts-box sheet metal 21 with the board mounting screws 23. The first power element 25 and the second power element 31 are attached to the refrigerant jacket 20 with the power-element mounting screw 24. Heat of the first power element 25 and second power element 31 is conducted to the refrigerant jacket 20 so as to be dissipated to the refrigerant flowing through the refrigerant pipe 14.

Figure 14:
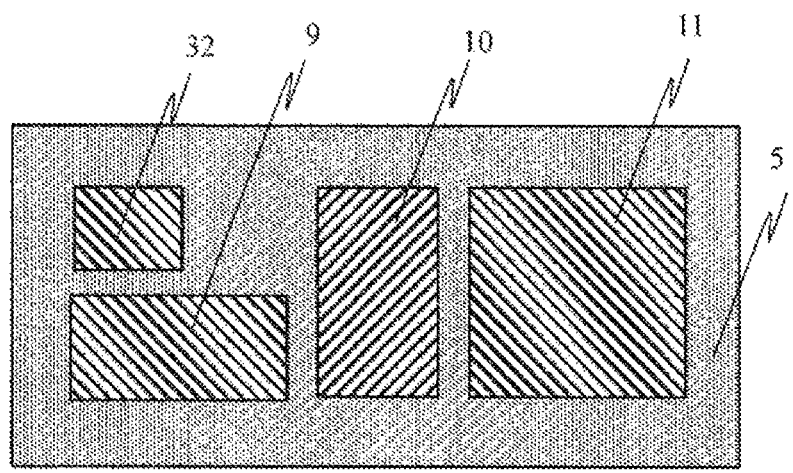
FIG. 14 is a front view of the electric parts box in the fifth embodiment of the present invention.

In FIG. 14, the first inverter board 9 and a second inverter board 32 are mounted on the electric parts box 5. The first inverter board 9 and the second inverter board 32 respectively drive compressors different from each other, or the first inverter board 9 drives the compressor 6 while the second inverter board 32 drives the fan motor 4. Power elements 25 are respectively mounted on the first inverter board 9 and the second inverter board 32, and are cooled with the unitedly-configured refrigerant jacket 20 as shown in FIG. 13.

Also in the present embodiment, the refrigerant jacket 20 is arranged on the rear surface of the electric parts box 5 in the path of the air blown by the blower fan 3, to allow for cooling the power elements 25 with the air blown by the blower fan 3, even when the refrigerant is not circulated, so that the power elements 25 are prevented from being damaged by generated heat.

The outdoor unit according to any of the first to fifth embodiment, as described above, is connected by piping with at least one indoor unit to constitute an air conditioner that prevents parts to be cooled such as a power element from being damaged to have improved reliability.

It should be noted that a so-called "vertical blow type" has been presented in the first to fifth embodiments of the present invention, in which the blower fan 3 is attached to the upper part of the outdoor unit for the air conditioner, but a person skilled in the art will appreciate that the same advantageous effects are obtained from a so-called "horizontal blow type" in which the blower fan 3 is attached to the front of the outdoor unit for the air conditioner.

In addition, several embodiments have been described hereinabove in order to solve the problems for the present application, but the present invention is not limited thereto. It is obvious that the embodiments may be modified within the spirit of the claims as appended, such as by combining embodiments or combining features of embodiments, as far as there is no contradiction.

The invention claimed is:

1. An outdoor unit for an air conditioner comprising:
a casing;
a refrigerant piping through which a refrigerant flows;
a heat exchanger that exchanges heat between the refrigerant flowing therein and air;
a blower fan, including a motor, that sucks air outside the casing and forces the air to pass through the heat exchanger;
an electric parts box that has a board and a power element; and
a refrigerant jacket that is thermally connected with the power element and cools the power element with the refrigerant flowing in the refrigerant jacket,
wherein the refrigerant jacket is disposed on an outer wall surface of the electric parts box in a path of the air blown by the blower fan, and
wherein the outer wall surface of the electric parts box, on which the refrigerant jacket is disposed, faces an inner central portion of the casing that is below the motor of the fan.

2. The outdoor unit for the air conditioner according to claim 1, wherein
the blower fan is arranged at an upper part of the casing so as to blow air within the casing upward, and
the electric parts box is disposed on a side surface of the casing.

3. The outdoor unit for the air conditioner according to claim 2, wherein
the casing includes a service opening that is openable and disposed at a position where the electric parts box is disposed on the side surface of the casing, wherein
the power element is viewed, when the service opening is open, at a position closer in depth to the service opening than the refrigerant jacket.

4. The outdoor unit for the air conditioner according to claim 3, wherein
a board mounting screw for fixing the board and a power element mounting screw for fixing the power element are screwed from sides of the board and the power element, which face the service opening.

5. The air conditioner comprising:
the outdoor unit for the air conditioner according to claim 4; and
at least one indoor unit,
wherein the outdoor unit is connected by piping with the at least one indoor unit.

6. The air conditioner comprising:
the outdoor unit for the air conditioner according to claim 3; and
at least one indoor unit,
wherein the outdoor unit is connected by piping with the at least one indoor unit.

7. The air conditioner comprising:
the outdoor unit for the air conditioner according to claim 2; and
at least one indoor unit,
wherein the outdoor unit is connected by piping with the at least one indoor unit.

8. The outdoor unit for the air conditioner according to claim 1, wherein
a cooling-member mounting screw for fixing the refrigerant jacket is screwed at a position closer to the power element than a board mounting screw for fixing the board.

9. The air conditioner comprising:
the outdoor unit for the air conditioner according to claim 8; and
at least one indoor unit,
wherein the outdoor unit is connected by piping with the at least one indoor unit.

10. The outdoor unit for the air conditioner according to claim 1, wherein
the electric parts box has an opening to allow for directly connecting the power element with the refrigerant jacket via the opening.

11. The air conditioner comprising:
   the outdoor unit for the air conditioner according to claim 10; and
   at least one indoor unit,
wherein the outdoor unit is connected by piping with the at least one indoor unit.

12. The outdoor unit for the air conditioner according to claim 1,
   wherein a portion of the refrigerant piping is disposed within the refrigerant jacket, and
   wherein the refrigerant jacket intervenes between the refrigerant pipe and the power element to thermally connect the refrigerant pipe with the power element.

13. The outdoor unit for the air conditioner according to claim 12, wherein
   the electric parts box contains more than one power element, and said more than one power element is thermally connected with the unitedly-configured refrigerant jacket.

14. The air conditioner comprising:
   the outdoor unit for the air conditioner according to claim 13; and
   at least one indoor unit,
wherein the outdoor unit is connected by piping with the at least one indoor unit.

15. The air conditioner comprising:
   the outdoor unit for the air conditioner according to claim 12; and
   at least one indoor unit,
wherein the outdoor unit is connected by piping with the at least one indoor unit.

16. The outdoor unit for the air conditioner according to claim 1, wherein
   the refrigerant pipe is in direct contact with the power element so as to be thermally connected with each other.

17. The air conditioner comprising:
   the outdoor unit for the air conditioner according to claim 16; and
   at least one indoor unit,
wherein the outdoor unit is connected by piping with the at least one indoor unit.

18. The outdoor unit for the air conditioner according to claim 1, wherein
   the electric parts box is formed of sheet metal, and the power element is thermally connected with the refrigerant jacket via the sheet metal of the electric parts box.

19. The air conditioner comprising:
   the outdoor unit for the air conditioner according to claim 18; and
   at least one indoor unit,
wherein the outdoor unit is connected by piping with the at least one indoor unit.

20. The air conditioner comprising:
   the outdoor unit for the air conditioner according to claim 1; and
   at least one indoor unit,
wherein the outdoor unit is connected by piping with the at least one indoor unit.

* * * * *